(12) United States Patent
Qiu et al.

(10) Patent No.: US 10,517,175 B2
(45) Date of Patent: Dec. 24, 2019

(54) BRACKET FOR ELECTRONIC COMPONENT, ELECTRONIC COMPONENT ASSEMBLY AND MOBILE TERMINAL

(71) Applicant: GUANGDONG OPPO MOBILE TELECOMMUNICATIONS CORP., LTD., Dongguan, Guangdong (CN)

(72) Inventors: Zeshuo Qiu, Guangdong (CN); Yu Jiang, Guangdong (CN); Jing Yang, Guangdong (CN); Qianqiang Chen, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 16/432,782

(22) Filed: Jun. 5, 2019

(65) Prior Publication Data
US 2019/0289720 A1    Sep. 19, 2019

Related U.S. Application Data

(63) Continuation of application No. 15/934,642, filed on Mar. 23, 2018, now Pat. No. 10,356,905.

(30) Foreign Application Priority Data

May 24, 2017   (CN) .......................... 2017 1 0377937
May 24, 2017   (CN) ...................... 2017 2 0595689 U

(51) Int. Cl.
*H02B 1/01*      (2006.01)
*H05K 1/18*      (2006.01)
*G06F 1/16*      (2006.01)
*H04M 1/02*      (2006.01)
*H05K 7/12*      (2006.01)

(52) U.S. Cl.
CPC ............. *H05K 1/18* (2013.01); *G06F 1/1658* (2013.01); *H04M 1/026* (2013.01); *H05K 7/12* (2013.01); *H04M 1/0264* (2013.01); *H05K 2201/10568* (2013.01)

(58) Field of Classification Search
USPC ......................................................... 361/825
See application file for complete search history.

(56) References Cited

U.S. PATENT DOCUMENTS 7,102,895 B1 *  9/2006  Copple ................ H05K 7/1418
                                                          361/759
9,084,340 B2 *  7/2015  Imamoto ............. H05K 5/0026

FOREIGN PATENT DOCUMENTS

CN           105282283 A      1/2016

* cited by examiner

*Primary Examiner* — Hung S. Bui
(74) *Attorney, Agent, or Firm* — Lathrop Gage LLP

(57) ABSTRACT

The present disclosure provides a bracket for an electronic component. The bracket includes a bearing part configured to bear an electronic component and two side walls. The two side walls are oppositely arranged and disposed at the same side of the bearing part. The two side walls of the bracket are configured to be disposed on a mainboard and define together with the mainboard and the two side walls an accommodating space. The present disclosure further provides an electronic component assembly and a mobile terminal.

20 Claims, 4 Drawing Sheets

BRACKET FOR ELECTRONIC COMPONENT, ELECTRONIC COMPONENT ASSEMBLY AND MOBILE TERMINAL

CROSS-REFERENCE TO RELATED APPLICATIONS

This application is a Continuation Application of U.S. application Ser. No. 15/934,642, filed Mar. 23, 2018, which claims priority to and benefits of Chinese Patent Application Nos. 201710377937.4 and 201720595689.6, filed with China National Intellectual Property Administration of PRC on May 24, 2017, the entire contents of which are incorporated herein by reference.

FIELD

The present disclosure relates to a field of electronic apparatuses, and more particularly to a bracket for an electronic component, an electronic component assembly and a mobile terminal.

BACKGROUND

With the development of technologies, components internally integrated in a mobile terminal are increasing to realize various functions, and correspondingly, a space inside the mobile terminal becomes increasingly compact.

During assembling and disassembling the mobile terminal, the inventor found that an electronic component and a camera unit occupy a large interior space of the mobile terminal, which is adverse to arrangement of other components inside the mobile terminal.

SUMMARY

The present disclosure provides a bracket for an electronic component, including:
a bearing part configured to bear an electronic component; and
two side walls oppositely arranged and disposed at the same side of the bearing part, the two side walls of the bracket being configured to be disposed on a mainboard and define together with the mainboard and the bearing part an accommodating space; the accommodating space being configured to at least partially accommodate a first flexible circuit board electrically connected to the electronic component, and the first flexible circuit board being electrically connected to the mainboard.

The present disclosure further provides the electronic component assembly, including the electronic component and the bracket for the electronic component; the bracket including the bearing part and the two side walls, the two side walls being oppositely arranged, the bearing part bearing the electronic component; the two side walls being disposed at the same side of the bearing part, the two side walls of the bracket being configured to be disposed on the mainboard and define together with the mainboard and the bearing part the accommodating space.

The present disclosure further provides the mobile terminal, including the mainboard and the electronic component assembly, the electronic component assembly including an electronic component and a bracket for an electronic component; the bracket including a bearing part and two side walls, the two side walls being oppositely arranged, the bearing part bearing the electronic component; the two side walls being disposed at the same side of the bearing part, the two side walls of the bracket being disposed to the mainboard, and the bearing part, the two side walls, and the mainboard defining the accommodating space, the accommodating space being configured to at least partially accommodate a first flexible circuit board electrically connected to the electronic component, and the first flexible circuit board being configured to be electrically connected to the mainboard.

BRIEF DESCRIPTION OF THE DRAWINGS

To describe technical solutions in the present disclosure more clearly, the following will briefly introduce the accompanying drawings required for the description of the embodiments. Obviously, the accompanying drawings described below show some embodiments of the present disclosure, and those skilled in the art can obtain other drawings based on these drawings without paying creative efforts.

DETAILED DESCRIPTION

Technical solutions in embodiments of the present disclosure will be clearly and completely described below with reference to the accompanying drawings in the embodiments of the present disclosure.

A mobile terminal 100 according to embodiments of the present disclosure may be any apparatus having communication and storage functions, such as a tablet computer, a mobile phone, an electronic reader, a remote controller, a personal computer (PC), a notebook computer, an on-board apparatus, an internet television, a wearable apparatus, or other smart apparatuses having internet function.

Figure 1:
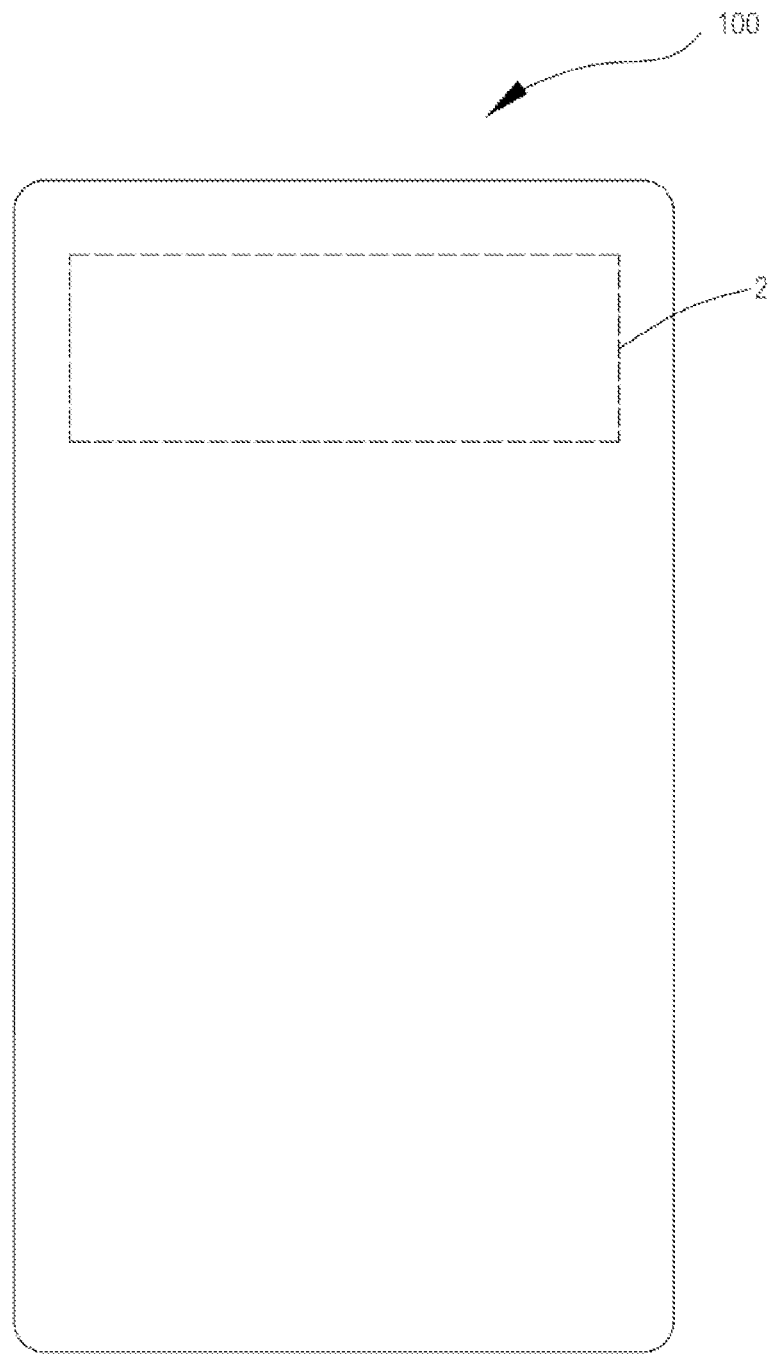
FIG. 1 is a schematic view of a mobile terminal provided by an embodiment of the present disclosure.
Figure 2:
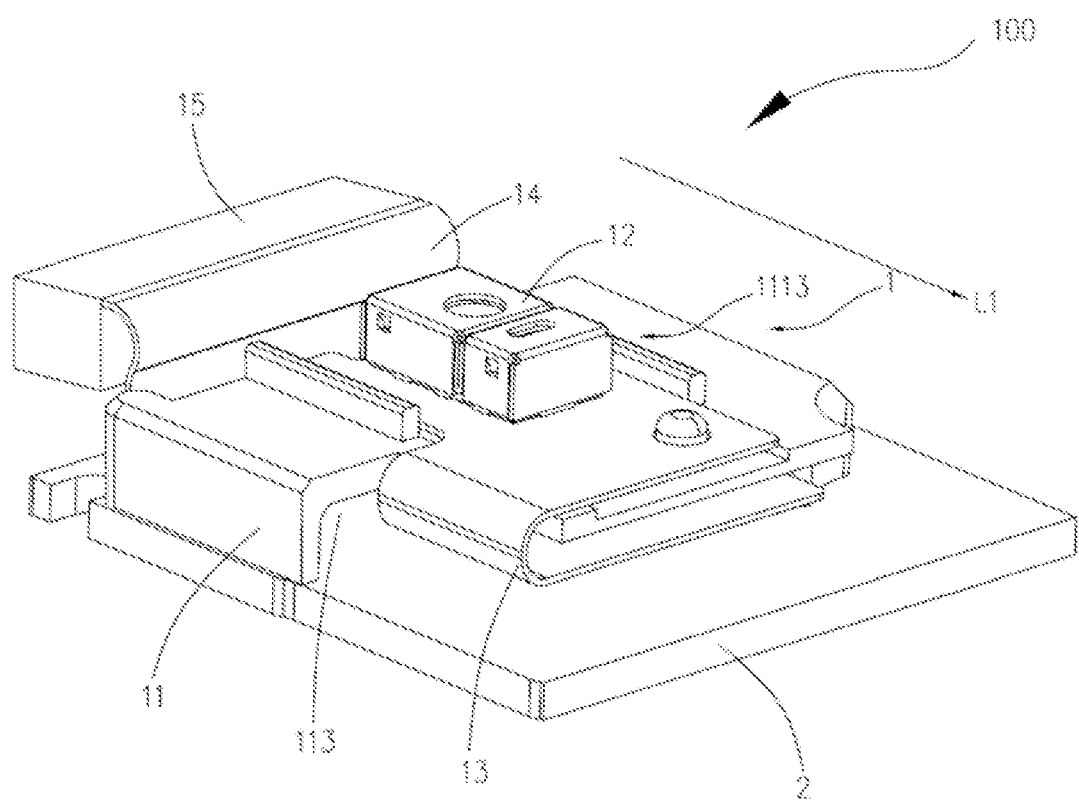
FIG. 2 is a partial view of the mobile terminal illustrated in FIG. 1.
Figure 3:
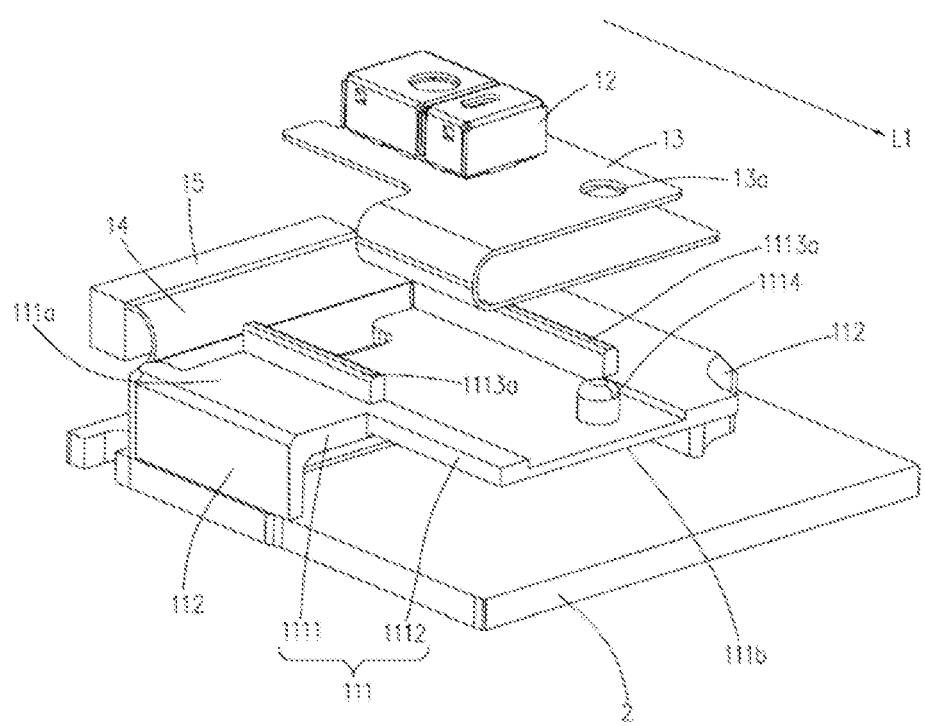
FIG. 3 is an exploded view of the mobile terminal illustrated in FIG. 2.

Referring to FIGS. 1 to 3, the present disclosure provides the mobile terminal 100, and the mobile terminal 100 includes an electronic component assembly 1 and a mainboard 2. The electronic component assembly 1 includes an electronic component 12 and a bracket 11 for an electronic component. The bracket 11 includes a bearing part 111 and two side walls 112. The two side walls 112 are oppositely arranged. The bearing part 111 bears the electronic component 12. The two side walls 112 are disposed at the same side of the bearing part 111. The two side walls 112 of the bracket 111 are configured to be disposed to the mainboard 2 and define together with the mainboard 2 and the two side walls 112 an accommodating space 113. The accommodating space 113 is configured to at least partially accommodate a first flexible circuit board 13 electrically connected to the electronic component 112, and the first flexible circuit board 13 is electrically connected to the mainboard 2.

Specifically, the mainboard 2 is configured to bear various components and provide passages for the various components. For example, two components are electrically connected to each other through a copper wire on the mainboard 2. The electronic component assembly 1 is also electrically connected to the mainboard 2.

Specifically, the bearing part 111 includes a first surface 111*a* and a second surface 111*b* oppositely arranged. The electronic component 12 is fixed to the first surface 111*a* of the bearing part 111, the two side walls 112 are both disposed on the second surface 111b of the bearing part 111. The two side walls 112 of the bracket 11 are fixed to the mainboard 2, and the bracket and the mainboard 2 define the accommodating space 113 configured to accommodate the component.

It should be understood that the electronic component 12 is a light sensor. Certainly, in other embodiments, the electronic component 12 may also be other components, such as a distance sensor, a telephone receiver, etc.

By applying the bracket 11, an upper surface and a lower surface of the bearing part 111 of the bracket 11 can be provided with the electronic component 12 and other components (such as a second flexible circuit board 14 electrically connected to a camera unit), correspondingly, thereby improving space utilization.

In the present embodiment, referring to FIG. 3, the bearing part 111 includes a first sub-plate 1111 and a second sub-plate 1112 integrally connected, the first sub-plate 1111 is in a rectangular shape, the second sub-plate 1112 extends and gradually tapers in a direction away from the first sub-plate 1111, and the two side walls 112 are correspondingly disposed at two edges of the first sub-plate 1111 oppositely arranged. The electronic component 12 is configured to be fixed to the first sub-plate 1111, and the second sub-plate 1112 is configured to bear the first flexible circuit board 13 electrically connected to the electronic component 12.

It should be understood that an extending direction of the second sub-plate 1112 is defined as a length direction L1 of the bearing part 111.

Figure 4:
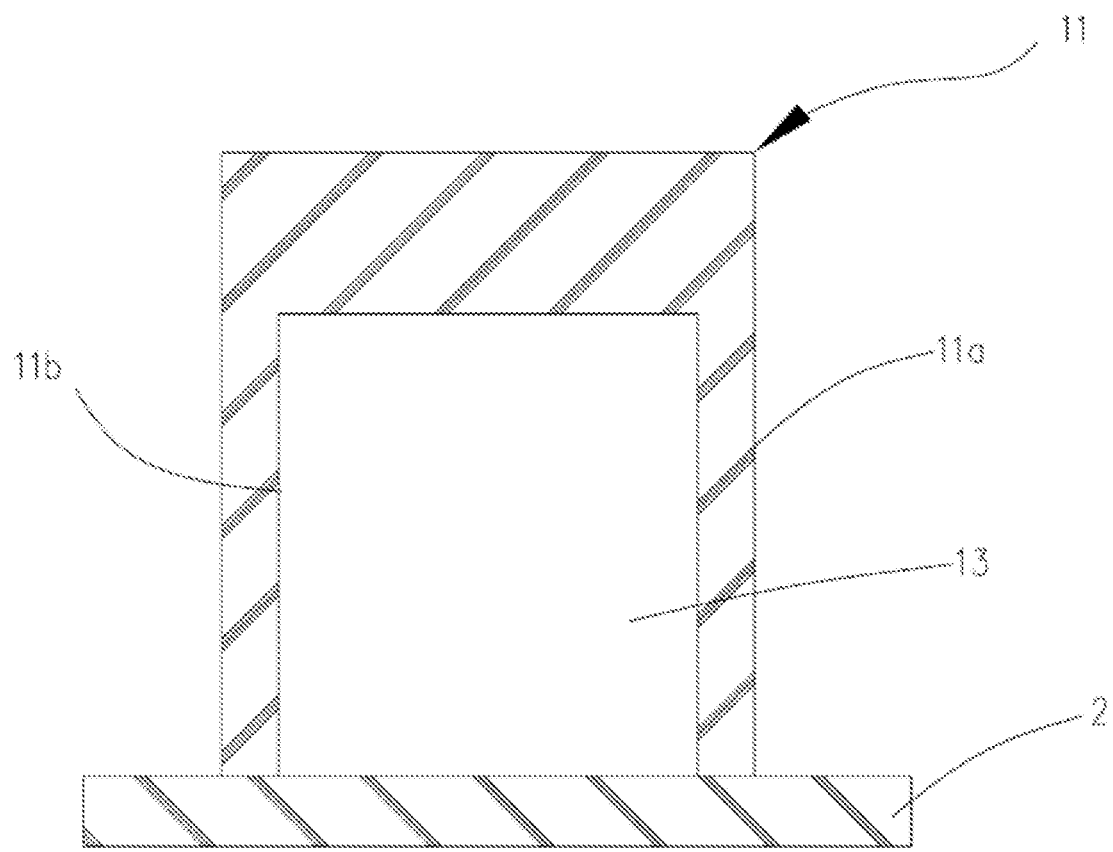
FIG. 4 is a sectional view of a bracket for an electronic component illustrated in FIG. 2.

Referring to FIGS. 3 and 4, the second surface 111b of the bearing part 111 of the bracket 11 and surfaces of the two side walls 112 facing each other form an inner surface 11b of the bracket 11, and the first surface 111a and surfaces of the two side walls facing away from each other form an outer surface 11a of the bracket 11. When the bracket 11 is fixedly connected to the mainboard 2 through the two side walls 112, the inner surface 11b of the bracket 11 and the mainboard 2 form the accommodating space 13, and the accommodating space 113 is configured to accommodate the components. The electronic component 12 is configured to be fixed to first surface 111a of the bearing part 111 of the bracket 11, and the components can be accommodated below the bearing part 111 of the bracket 11, that is, the arrangement of the bracket 11 improves a longitudinal space utilization of the mainboard 2, such that the components inside the mobile terminal 100 can be arranged more compactly.

It should be understood that, the side wall 112 is in a strip shape, the two side walls 112 are vertically connected to the edges of the second surface 111b of the bearing part 111. The shape of the side walls 112 and the vertical coupling relation between the side walls 112 and the bearing part 111 enable the inner surface 11b of the bracket 11 to have a rectangular shape, and the rectangular space is large, such that more components or the component having a large area can be accommodated, thereby further improving the space utilization of the mobile terminal 100. Certainly, in other embodiments, the inner surface 11b of the bracket 11 may also be arched or V-shaped and etc.

It should be understood that the two side walls 112 are adhered to the mainboard 2 through a double sided adhesive tape. Certainly, in other embodiments, the two side walls 112 may also be connected to the mainboard 2 through a screw or snap.

Further, referring to FIGS. 2 and 3, the electronic component assembly 1 further includes the first flexible circuit board 13, a first end of the first flexible circuit board 13 is connected to the electronic component 12, a second end of the first flexible circuit board 13 extends out of the bearing part 111 in a direction away from the electronic component 12, and the second end of the first flexible circuit board 13 is bent along a side edge of the bearing part 111 and extends above the second surface 111b of the bearing part 111 and into the accommodating space 113. The electronic component 12 is electrically connected to the mainboard 2 of the mobile terminal 100 through the first flexible circuit board 13, such that the electronic component 12 does not need to be welded to the mainboard 2 and is prevented from being directly disposed to the mainboard 2 to occupy the space of the mainboard 2.

It should be understood that, the first end of the first flexible circuit board 13 is electrically connected to the electronic component 12, a portion of the first flexible circuit board 13 connected to the electronic component 12 is adhered to the first sub-plate 1111, the second end of the first flexible circuit board 13 extends towards the second sub-plate 1112, that is, the first flexible circuit board 13 is fixed to the second sub-plate 1112, and an excess part of the first flexible circuit board 13 in length compared with the second sub-plate 1112 is bent along the side edge of the second sub-plate 1112 and extends into the accommodating space 113, without occupying a space in the length direction L1 of the bearing part 111. The gradually tapering structure of the second sub-plate 1112 of the bearing part 111 enables the first flexible circuit board 13 to be bent and extend into the accommodating space 13, facilitating arrangements of the light sensor and the first flexible circuit board 13.

It should be understood that, the electronic component assembly 1 further includes an electric connector, and the electric connector is configured to be connected between the second end of the first flexible circuit board 13 away from the electronic component 12 and the mainboard 2 of the mobile terminal 100. Specifically, the second end of the first flexible circuit board 13 is connected to the electric connector, that is, the first flexible circuit board 13 is connected to the mainboard 2 through the electric connector, thereby ensuring good electrical coupling between the electronic component 12 and the mainboard 2, and facilitating a pluggable coupling between the first flexible circuit board 13 and the mainboard 2. Certainly, in other embodiments, the second end of the first flexible circuit board 13 away from the electronic component 12 may also be directly welded to the mainboard 2.

For further improvement, referring to FIG. 3, the electronic component assembly 1 further has a first position limiting structure 1113, the first position limiting structure 1113 includes two strip-shaped protrusions 1113a, the two strip-shaped protrusions 1113a protrude from the bearing part 111 and are oppositely arranged, and the electronic component 12 is located between the two strip-shaped protrusions 1113a. By providing the first position limiting structure 1113, the electronic component 12 is fixed to the bearing part 111 and doesn't tend to move, thereby improving reliability of the electronic component assembly 1 and the mobile terminal 100.

Specifically, the first position limiting structure 1113 is disposed to the first sub-plate 1111, the two strip-shaped protrusions 1113a both extend in the length direction L1 of the bearing part 111, a distance between the two strip-shaped protrusions 1113a is the same as a size of the portion of the first flexible circuit board connected with the electronic component 12, therefore the portion of the first flexible circuit board connected with the electronic component 12 can be better fixed to the first sub-plate 1111, improving the reliability of the electronic component assembly 1 and the mobile terminal 100.

For further improvement, referring to FIG. 3, the bracket 11 further includes a limiting protrusion 1114. The limiting protrusion 1114 protrudes from the bearing part 111, and the limiting protrusion 1114 is located outside an area occupied by the two strip-shaped protrusions 1113a. The first flexible circuit board 13 defines a limiting hole 13a, and the limiting protrusion 1114 passes through the limiting hole 13a of the first flexible circuit board 13. By providing the limiting protrusion 1114, the first flexible circuit board 13 can be better fixed to the bearing part 111, such that the first flexible circuit board 13 can be better fixed to the bearing part 111, improving the reliability of the electronic component assembly 1 and the mobile terminal 100.

Specifically, the limiting protrusion 1114 is a column-shaped protrusion, the limiting protrusion 1114 protrudes from the second sub-plate 1112, that is, the limiting protrusion 1114 is located outside the area occupied by the two strip-shaped protrusions 1113a, and the limiting protrusion 1114 is adjacent to an edge of the second sub-plate 1112. The limiting protrusion 1114 passes through the limiting hole of the first flexible circuit board 13, such that the first flexible circuit board 13 can be better fixed to the bearing part 111, improving the reliability of the electronic component assembly 1 and the mobile terminal 100. Certainly, in other embodiments, the limiting protrusion 1114 may also be a rectangular protrusion, or in a spherical shape and etc.

It should be understood that, referring to FIGS. 2 and 3, the mobile terminal 100 further includes the second flexible circuit board 14 configured to be electrically connected to the camera unit 15, and the second flexible circuit board 14 is located in the accommodating space 113 of the bracket 11.

Specifically, since the camera unit 15 and the electronic component 12 are generally disposed in the length direction L1 of the bearing part 111, by accommodating the second flexible circuit board 14 configured to be connected to the camera unit 15 in the accommodating space 113 of the bracket 11, a distance between the camera unit 15 and the electronic component 12 is reduced, a distance between the camera unit 15 and the electronic component 12 in the length direction L1 of the bearing part 111 is reduced, and the space of the electronic component assembly 1 and the mobile terminal 100 is saved.

It should be understood that, the mobile terminal 100 further includes the camera unit 15, and the camera unit 15 is electrically connected to the second flexible circuit board 14.

During the assembly of the mobile terminal 100, the two side walls 112 of the bracket 11 are adhered to the mainboard 2 so as to define the accommodating space 113 between the bracket 11 and the mainboard 2. The portion of the first flexible circuit board 13 connected with the electronic component 12 (the light sensor) is adhered to the first sub-plate 1111. The limiting protrusion 1114 of the second sub-plate 1112 passes through the limiting hole 13a of the first flexible circuit board 13. The portion of the first flexible circuit board 13 extending out of the second sub-plate 1112 is bent along the side edge of the second sub-plate 1112, extends into the accommodating space 113, and is electrically connected to the mainboard 2 through the electric connector, achieving the electric coupling between the electronic component 12 and the mainboard 2. A first end of the second flexible circuit board 14 is connected to the camera unit 15, and a second end of the second flexible circuit board 14 extends into the accommodating space 13 and is electrically connected to the mainboard 2, achieving the electric coupling between the camera unit 15 and the mainboard 2.

The bracket 11 provided by the present disclosure includes the bearing part 111 and the two side walls 112, the electronic component 12 can be fixed to the bearing part 111, and the two side walls 112 are disposed on a mounting plane, such as a surface of the mainboard 2, so that the components can be accommodated between the bearing part 111 and the mounting plane, that is, the components, such as the second flexible circuit board 14 electrically connected to the camera unit 15, can be disposed below the electronic component 12, thereby improving the space utilization.

In the electronic component assembly 1 and the mobile terminal 100 provided by the present disclosure, by applying the above electronic component assembly bracket 11, the upper surface and the lower surface of the bearing part 111 of the bracket 11 can be correspondingly provided with the electronic component 12 and other components (such as the second flexible circuit board 14 electrically connected to the camera unit 15), thereby improving the space utilization.

The above reveals preferred embodiments of the present disclosure, it should be noted that, it is also possible for those skilled in the art to further make some improvements and modifications without departing from the principle of the present disclosure, and these improvements and modifications are deemed to fall into the scope of the present disclosure.

What is claimed is:

1. A bracket for an electronic component, comprising:
a bearing part;
two side walls oppositely arranged at the same side of the bearing part;
a position limiting structure comprising two strip-shaped protrusions, the two strip-shaped protrusions being located at two edges of the bearing part; and
a limiting protrusion located on an area of the bearing part not occupied by the two strip-shaped protrusions.

2. The bracket according to claim 1, wherein the bearing part comprises a first surface and a second surface opposite to the first surface, and the two side walls are both arranged onto the second surface.

3. The bracket according to claim 2, wherein the two side walls are in strip shapes and vertically connected to side edges of the second surface.

4. The bracket according to claim 2, wherein a section of the bracket is in a V-shape.

5. The bracket according to claim 1, wherein the bearing part comprises a first sub-plate and a second sub-plate integrally connected with the first sub-plate, and the second sub-plate extends and tapers gradually in a direction away from the first sub-plate.

6. The bracket according to claim 5, wherein the two side walls are correspondingly disposed at two edges of the first sub-plate.

7. The bracket according to claim 5, wherein the first sub-plate comprises a first surface and a second surface opposite to the first surface, and the two side walls are correspondingly arranged onto two edges of the second surface.

8. The bracket according to claim 7, wherein the two strip-shaped protrusions are arranged on the first surface.

9. The bracket according to claim 5, wherein the second sub-plate comprises a first surface and a second surface opposite to the first surface, and the limiting protrusion is located on the first surface.

10. The bracket according to claim 5, wherein the two strip-shaped protrusions are arranged on the first sub-plate, and the limiting protrusion is located on the second sub-plate.

11. The bracket according to claim 5, wherein in a direction from one of the two strip-shaped protrusions to another one of the two strip-shaped protrusions, a length of the second sub-plate is less than a length of the first sub-plate.

12. The bracket according to claim 1, wherein the position limiting structure is disposed on top of the bearing part, and the two strip-shaped protrusions both extend in a length direction of the bearing part.

13. An electronic component assembly, comprising: an electronic component and a bracket; the bracket comprising a bearing part and two side walls, the two side walls being corresponding arranged at two edges of the bearing part, the bearing part bearing the electronic component; the two side walls being disposed at the same side of the bearing part and being configured to be disposed on a mainboard and define together with the mainboard and the bearing part an accommodating space;
wherein the bearing part comprises a first sub-plate and a second sub-plate integrally connected, and the bracket has a limiting protrusion arranged on the second sub-plate.

14. The electronic component assembly according to claim 13, wherein the bracket further has a position limiting structure, the position limiting structure comprises two strip-shaped protrusions, the two strip-shaped protrusions are located at two edges of the first sub-plate, and the electronic component is located between the two strip-shaped protrusions.

15. The electronic component assembly according to claim 13, wherein the electronic component assembly further comprises a first flexible circuit board, the first flexible circuit board is at least partially accommodated in the accommodating space, a first end of the first flexible circuit board is electrically connected to the electronic component, and a second end of the first flexible circuit board extends out of the bearing part in a direction away from the electronic component, bends along a side edge of the bearing part and extends into the accommodating space, and is electrically connected to the mainboard.

16. The bracket according to claim 15, wherein the electronic component is configured to be fixed to the first sub-plate and the second sub-plate is configured to bear the first flexible circuit board.

17. The electronic component assembly according to claim 15, wherein the first flexible circuit board defines a limiting hole, and the limiting protrusion passes through the limiting hole to enable the first flexible circuit board to be fixed.

18. The electronic component assembly according to claim 15, further comprising a second flexible circuit board configured to be electrically connected to a camera unit and partially accommodated in the accommodating space.

19. A bracket for an electronic component, comprising:
a bearing part configured to bear an electronic component; and
two side walls oppositely arranged and disposed at the same side of the bearing part, the two side walls of the bracket being configured to be disposed on a mainboard and define together with the mainboard and the bearing part an accommodating space; the accommodating space being configured to at least partially accommodate a first flexible circuit board electrically connected to the electronic component, and the first flexible circuit board being configured to be electrically connected to the mainboard;
wherein a section of the bracket is in a V-shape.

20. The bracket of claim 19, further comprising two strip-shaped protrusions and a column-shaped limiting protrusion, the two strip-shaped protrusions being located at a first part of the bearing part, the column-shaped limiting protrusion being located at a second part of the bearing part, the first part being spaced apart from the second part.

* * * * *